(12) United States Patent
Thoppay Egambaram et al.

(10) Patent No.: US 9,857,864 B1
(45) Date of Patent: Jan. 2, 2018

(54) SYSTEMS AND METHODS FOR REDUCING POWER CONSUMPTION IN A MEMORY ARCHITECTURE

(71) Applicant: Amazon Technologies, Inc., Seattle, WA (US)

(72) Inventors: Sathish Thoppay Egambaram, Plano, TX (US); Robert Nasry Hasbun, Fall City, WA (US)

(73) Assignee: Amazon Technologies, Inc., Seattle, WA (US)

( * ) Notice: Subject to any disclaimer, the term of this patent is extended or adjusted under 35 U.S.C. 154(b) by 151 days.

(21) Appl. No.: 14/527,368

(22) Filed: Oct. 29, 2014

(51) Int. Cl.
*G06F 1/32* (2006.01)
*G06F 12/02* (2006.01)
*G11C 14/00* (2006.01)
*G11C 13/00* (2006.01)

(52) U.S. Cl.
CPC ........ *G06F 1/3275* (2013.01); *G06F 12/0246* (2013.01); *G11C 14/0045* (2013.01); *G06F 2212/7201* (2013.01); *G11C 13/0038* (2013.01)

(58) Field of Classification Search
CPC .............. G06F 1/3275; G06F 12/0246; G06F 2212/7201; G11C 13/0038; G11C 14/0045
USPC ........................................................ 711/103
See application file for complete search history.

(56) References Cited

U.S. PATENT DOCUMENTS

| | | | | |
|---|---|---|---|---|
| 5,297,269 | A * | 3/1994 | Donaldson | G06F 12/0828 711/130 |
| 5,632,038 | A * | 5/1997 | Fuller | G06F 1/3203 711/144 |
| 6,105,141 | A * | 8/2000 | Hanlon | G06F 1/3203 713/323 |
| 6,507,523 | B2 | 1/2003 | Pekny | |
| 2008/0077813 | A1* | 3/2008 | Keller | G06F 1/3203 713/320 |
| 2008/0104329 | A1* | 5/2008 | Gaither | G06F 12/0888 711/138 |
| 2010/0185821 | A1* | 7/2010 | Paver | G06F 12/0831 711/146 |
| 2011/0197017 | A1* | 8/2011 | Yu | G06F 12/0246 711/103 |

(Continued)

OTHER PUBLICATIONS

Micron Technology, Inc. "TN-46-15: Low-Power Versus Standard DDR SDRAM", updated Dec. 2007.*

(Continued)

*Primary Examiner* — Reginald Bragdon
*Assistant Examiner* — Aaron D Ho
(74) *Attorney, Agent, or Firm* — Eversheds Sutherland (US) LLP

(57) ABSTRACT

According to one or more embodiments of the disclosure, systems and methods for reducing power consumption in a memory architecture are provided. In one embodiment, a method may include determining a transition from a first power state to a second power state. The method may also include determining, using a page location identifier to access a page location table, a first dirty memory page indication. Furthermore, the method may include copying data stored in a first memory location in a volatile memory corresponding to the page location identifier to a second memory location in a non-volatile memory corresponding to the page location identifier. The method may also include deactivating the volatile memory.

18 Claims, 8 Drawing Sheets

(56) References Cited

U.S. PATENT DOCUMENTS

| | | | | |
|---|---|---|---|---|
| 2013/0111134 | A1* | 5/2013 | Benhase | G06F 12/0811 |
| | | | | 711/122 |
| 2013/0346683 | A1* | 12/2013 | Walker | G06F 12/0804 |
| | | | | 711/105 |
| 2014/0147034 | A1* | 5/2014 | Ito | G06T 1/60 |
| | | | | 382/155 |

OTHER PUBLICATIONS

Jacob, B., Wang, D., and Ng, S., "Memory Systems: Cache, DRAM, Disk", 2008, Elsevier Inc., p. 69-70, retrieved online from ScienceDirect.*

Jouppi, N. P., "Cache Write Policies and Performance," Computer Architecture News vol. 21, No. 2, 1993, p. 191-201.*

Kozierok, C. M., "Cache Write Policy and the Dirty Bit", last updated Apr. 17, 2001, published by the PC Guide, <http://www.pcguide.com/ref/mbsys/cache/funcWrite-c.html>.*

Matthews, J., Trika, S., Hensgen, D., Coulson, R., and Grimsrud, K., "Intel Turbo Memory: Nonvolatile disk caches in the storage hierarchy of mainstream computer systems", ACM Transactions on Storage, vol. 4, No. 2, article 4, May 2008.*

Micron Technology, Inc., "TN-46-12: Mobile DRAM Power-Saving Features/Calculations Introduction", copyrighted 2005.*

"indicative—Definition from the Merriam-Webster Online Dictionary", retrieved Apr. 23, 2009 via the WayBack Machine, <https://web.archive.org/web/20090423013859/https://www.merriam-webster.com/dictionary/indicative>.*

"indicate—Defintion from the Merriam-Webster Online Dictionary", retrieved Apr. 23, 2009 via the WayBack Machine, <https://web.archive.org/web/20090423014039/https://www.merriam-webster.com/dictionary/indicate>.*

Bell, J., Casasent, D., and Bell, C.G., "An Investigation of Alternative Cache Organizations," in IEEE Transactions on Computers, vol. C-23, No. 4, pp. 346-351, Apr. 1974. doi: 10.1109/T-C.1974.223948.*

Fallah, Farzan and Pedram, Massoud, "Standby and Active Leakage Current Control and Minimization in CMOS VLSI Circuits"; IEICE Transactions (2005) pp. 509-519.

"Advanced Solid-State Memory Systems and Products: Emerging Non-Volatile Memory Technologies, Industry Trends and Market Analysis"; Innovative Research and Products, Inc., Report ET-114 (Apr. 2011) p. 146.

* cited by examiner

SYSTEMS AND METHODS FOR REDUCING POWER CONSUMPTION IN A MEMORY ARCHITECTURE

BACKGROUND

Power consumption and/or battery life often presents challenges in user devices. Various methods for reducing power consumption of the user device may be sought after. In certain cases, power savings for the user device may be realized through reducing power draw associated with particular components of the user device, such as memory.

Figure 1A:
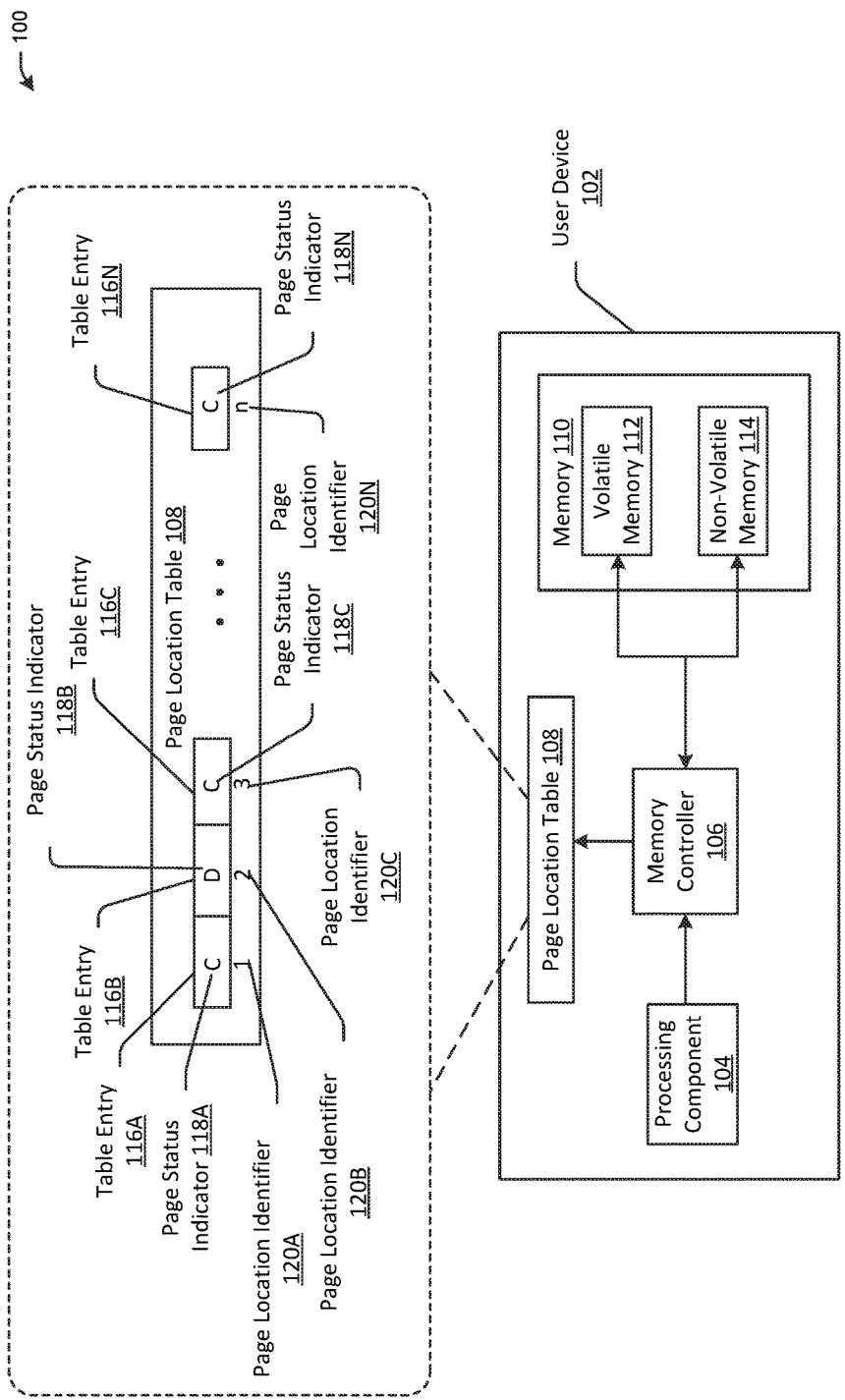
FIG. 1A illustrates a schematic diagram of an example system architecture in accordance with one or more embodiments of the disclosure.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Described herein are embodiments of systems and methods for reducing power consumption in a memory architecture. According to one or more embodiments, example memory architectures described herein can be used in any number of user devices and/or associated system architectures. Furthermore, power consumption in the example memory architectures may be reduced by deactivating at least one memory based on a power state of a user device. In at least one embodiment, an example user device may include a processor, a memory controller, a page location table, and memory. The memory may include a volatile memory (e.g., dynamic random access memory (DRAM)) and a non-volatile memory (e.g., resistive random access memory (RRAM), phase-change memory (PCM), and/or the like). When the user device transitions to low power states, such as suspend mode, sleep mode, standby mode, and/or the like, device state data for the user device may be stored in DRAM, and the power provided to various other components (e.g., processor, display, etc.) may be reduced. However, in order to maintain data integrity, the DRAM may periodically refresh the charges of its capacitors (hereinafter referred to as "self-refresh"). As such, each self-refresh operation may require a certain amount of power consumption. Therefore, reducing instances where the DRAM performs self-refresh may facilitate a reduction in power consumption in a memory architecture that uses DRAM. It will be appreciated that while the description may reference certain operations performed with respect to DRAM, such operations may be performed with respect to any other type of volatile memory as well.

Thus, in broad terms, when the user device receives an indication to transition into a low power state, the device state data may be stored into the non-volatile memory. Thus, when the user device transitions from the low power state back to an active state (e.g., the user device "wakes up"), data that is to be read may initially be read from a memory location in the non-volatile memory. However, when data is to be written to, the data may be written instead to a memory location in DRAM. Thereafter, any subsequent read requests for the particular memory location may be read from the corresponding memory location in DRAM until the user device transitions back to the low power state and the device state data is again stored in the non-volatile memory.

For instance, in certain implementations, the memory controller of the user device may receive an indication that the user device is transitioning into a low power state. In response, the memory controller may access a page location table having one or more table entries. Each of the table entries may store a respective page status indicator, and each of the table entries may be associated with a page location identifier. Thus, a particular table entry may store a particular page status indicator and may be associated with a particular page location identifier. The particular page status indicator may indicate whether a memory location associated with the particular page location identifier is clean or dirty. If the memory location is clean (e.g., the memory location has not been written during a time period, such as the time since the last device wake up from a low power state) the particular page status indicator may indicate a clean memory page. If the memory location is dirty (e.g., the memory location has been written during a time period, such as the time since the last device wake up from a low power state) the particular page status indicator may indicate a dirty memory page. Additionally, the particular page location identifier may provide an index to the particular table entry. Furthermore, the particular page location identifier may indicate a corresponding memory location in the DRAM and/or the nonvolatile memory. Furthermore, a clean memory page indication may indicate that the most recently written memory page corresponding to the memory location is located in non-volatile memory. On the other hand, a dirty memory page indication may indicate that the most recently written memory page corresponding to the memory location is located in the DRAM.

In certain embodiments, the particular page location identifier may provide a direct correspondence to the memory location in the DRAM and/or the nonvolatile memory (e.g., a page location identifier may correspond to memory location or memory address in the DRAM and/or non-volatile memory). In other implementations, various offset values, formulas, and/or other algorithms may be applied to the particular page location identifier to determine the corresponding memory location in the DRAM and/or the non-volatile memory.

Referring back to the access of the page location table, the memory controller may access a first page table entry using a first page location identifier. The memory controller may determine whether a first page status indicator stored in the first page table entry indicates a clean memory page or a dirty memory page. If the first page status indicator indicates a clean memory page, the memory controller may access another page table entry (e.g., the next adjacent page table entry) to perform a similar determination. If, however, the first page status indicator indicates a dirty memory page, the memory controller may copy data from a memory location in the DRAM corresponding to the first page location identifier. The memory controller may write the copied data to a second memory location in the non-volatile memory also corresponding to the first page location identifier. The memory controller may then access another page table entry, and the memory controller may repeat this until all of the page table entries in the page location table have been accessed and/or analyzed.

As a result, the memory controller may copy the data from the memory locations in DRAM corresponding to a dirty memory page, and write the copied data to corresponding memory locations in the non-volatile memory. Moreover, the memory controller may deactivate the DRAM, such as upon completion of the copy/write operations from the DRAM to the non-volatile memory. The user device may then transition to the low power state.

FIG. 1A is a schematic diagram depicting an illustrative system architecture 100 in accordance with one or more example embodiments of the disclosure. The illustrative architecture 100 may include a user device 102. The user device 102 may include any suitable user device including, without limitation, a smartphone or other cellular device, a tablet device, an electronic reader device, a desktop computing device, a laptop computing device, a gaming console, a wearable computing device, a multimedia content streaming device, a television such as Smart TV, a server, or any other device capable of receiving content (e.g., web content) over one or more networks and rendering the content for presentation to a user. While various illustrative components of the architecture 100 may be described herein in the singular, it should be appreciated that multiple ones of any such components may be provided in various example embodiments of the disclosure.

Furthermore, the user device 102 may include a processing component 104, a memory controller 106, a page location table 108, and memory 110 in communication with each other. The memory 110 may include volatile memory 112 and non-volatile memory 114. While depicted separately from the memory 110, the page location table 108 may, in certain implementations, be stored in memory 110, in other memory, and/or any other storage location (not illustrated) included in the user device 102.

FIG. 1A may also depict a magnified view of the page location table 108. The page location table 108 may include one or more table entries 116A-116N. The table entries 116A-116N may store respective page status indicators 118A-118N. Furthermore, the table entries 116A-116N may also be associated with respective page location identifiers 120A-120N. According to certain embodiments, a particular page status indicator 118A-118N may indicate whether a memory location associated with the corresponding page location identifier 120A-120N is clean or dirty. For instance, page status indicator 118A may represent a clean memory page, which may indicate that a memory location corresponding to page location identifier 120A has not been written for a particular time period, (e.g., the time period since the user device 102 last woke up from a low power state). Additionally, the page status indicator 118B may represent a dirty memory page, which may indicate that a memory location corresponding to page location identifier 120B has been written during a particular time period, (e.g., the time period since the user device 102 last woke up from a low power state). Furthermore, the dirty memory page may indicate that the data stored in the memory location in the volatile memory 112 corresponding to page location identifier 120B may be newer than the data stored in the memory location in the non-volatile memory 114 corresponding to the page location identifier 120B.

Additionally, the page location identifiers 120A-120N may provide respective indices to the corresponding table entries 116A-116N in the page location table 108. Furthermore, the page location identifiers 120A-120N may indicate corresponding memory locations (e.g., memory addresses) in the volatile memory 112 and/or the nonvolatile memory 114. In certain embodiments, a particular page location identifier 120A-120N may provide a direct correspondence to a memory location in the volatile memory 112 and/or the nonvolatile memory 114 (e.g., page location identifier 120A may correspond to memory location or memory address 1 in the volatile memory 112 and/or non-volatile memory 114). In other implementations, various offset values, formulas, and/or other algorithms may be applied to the particular page location identifier 120A-120N to determine the corresponding memory location in the volatile memory 112 and/or the non-volatile memory 114.

Referring now to other illustrative elements of FIG. 1A, according to one or more embodiments, the memory controller 106 may be configured to facilitate write operations and/or read operations to or from the volatile memory 112 and/or the non-volatile memory 114 depending on a power state of the user device 102. For instance, in certain implementations, the memory controller 106 may receive an indication, such as from the processing component 104, that the user device 102 is transitioning into a low power state. A low power state may be any power state associated with a reduced amount of power provided to the user device 102 compared to a normal operating state (e.g., an active state) of the user device 102. For example, the low power state may refer to a suspend state, standby state, sleep state, and/or the like. In response to the indication to transition to the low power state, the memory controller 106 may access the page location table 108 to determine one or more memory locations in the volatile memory 112 from which to copy and write data to the non-volatile memory 114.

For instance, the memory controller 106 may access table entry 116A using page location identifier 120A. As such, the memory controller 106 may determine page status indicator 118A, which is stored in table entry 116A, indicates a clean memory page. Upon determining that page status indicator 118A indicates a clean memory page, the memory controller 106 may access another table entry, such as table entry 116B using page location identifier 120B. As such, the memory controller 106 may determine page status indicator 118B, which is stored in table entry 116B, indicates a dirty memory page. Upon determining that page status indicator 118B indicates a dirty memory page, the memory controller 106 may copy data from a memory location in the volatile memory 112 corresponding to page location identifier 120B. Furthermore, the memory controller 106 may write the copied data to a second memory location in the non-volatile memory 114, which may also correspond to page location identifier 120B. The memory controller 106 may also access each of the rest of the rest of the table entries 116C-116N in the page location table 108, and apply similar logic and determination as described with respect to table entry 116A and 116B. In certain implementations, the memory controller 106 may sequentially access the table entries 116A-116N although various other orders of accessing the table entries 116A-116N are also contemplated.

As a result of the operations described above, the memory controller 106 may copy data from memory locations in the volatile memory 112 corresponding to dirty memory pages, and write the copied data to corresponding memory locations in the non-volatile memory. Upon completion of copying the data, the memory controller 106 may deactivate the volatile memory 112, and the user device 102 may transition to the low power state. According to one or more embodiments, deactivating the volatile memory 112 may include deactivating a memory refresh operation and/or capability of the volatile memory 112. For instance, the memory refresh operation of the volatile memory 112 may cause the charges of one or more capacitors in the volatile memory 112 to be restored. Restoration of the charges in the capacitors may enable the volatile memory 112 to maintain the integrity of its data. However, the memory refresh operation may be associated with additional power consumption by the volatile memory 112. Thus, deactivating the memory refresh operation and/or capability of the volatile memory 112 may reduce power consumption of the user device 102. In other implementations, however, the deactivating the volatile memory 112 may include reducing the power supplied to the volatile memory 112 and/or switching the volatile memory 112 to an off state.

Additionally, in response to the user device 102 transitioning to the lower power state, the memory controller 106 may "clear" the page location table 108 by storing a clean memory page indication in each of the table entries 116A-116N. As a result, each of the page status indicators 118A-118N may indicate a clean memory page after a clear. In other implementations, the memory controller 106 may clear the page location table 108 on a per table entry basis. In other words, the memory controller 106 may store a clean memory page indication in table entries 116A-116N that store respective page status indicators 118A-118N indicating a dirty memory page, and the memory controller 106 may take no action with respect to page status indicators 118A-118N that indicate a clean memory page. For instance, referring to the above example where the memory controller 106 determines page status indicator 118B to indicate a dirty memory page, the memory controller 106 may also, upon copying the data, store a clean memory page indication in table entry 116B.

As a result of deactivation, the volatile memory 112 may consume less power from the user device 102 while the user device 102 is in the lower power state. Furthermore, the state (e.g., stored data) of the user device 102 before transitioning into the low power state may still be preserved in the non-volatile memory 114, which may consume relatively little or no power in the low power state. In addition, the volatile memory 112 (e.g., and/or operations associated with the volatile memory 112) may remain deactivated until the user device "wakes up" from the low power state and/or transitions back to an active state.

According to certain embodiments, the memory controller 106 may also facilitate write and read operations to and from the volatile memory 112 and/or the non-volatile memory 114 while the user device 102 is in an active state (e.g., not in a low power state). For instance, the memory controller 106 may receive an indication and/or instructions, such as from the processing component 104, to write and/or read to or from a memory location corresponding to a page location identifier 120A-120N.

Figure 1B:
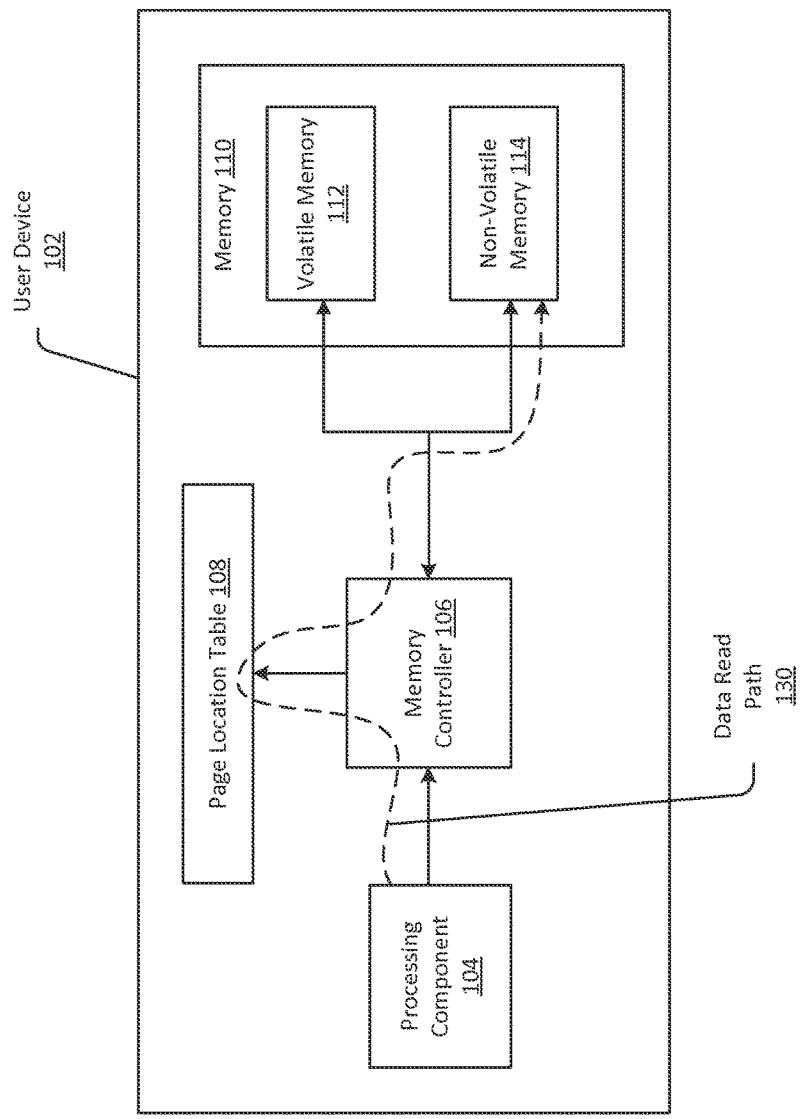
FIG. 1B illustrates a schematic diagram of an example data read path in accordance with one or more embodiments of the disclosure.

FIG. 1B illustrates a block diagram depicting an example data read path for reading a memory location according to one or more example embodiments. For example, the memory controller 106 may receive an indication (e.g., from the processing component 104) to read data from a memory location corresponding to page location identifier 120A. In response, and following the data read path 130, the memory controller 106 may read the page status indicator 118A from table entry 116A. As shown in FIG. 1A, the page status indicator 118A may indicate a clean memory page. In certain embodiments, the clean memory page may indicate that the newest version and/or copy of data that has been written to a memory location corresponding to page location identifier 120A is stored in the non-volatile memory 114. As a result, the memory controller 106 may read data stored in the memory location of the non-volatile memory 114 corresponding to page location identifier 120A.

Figure 1C:
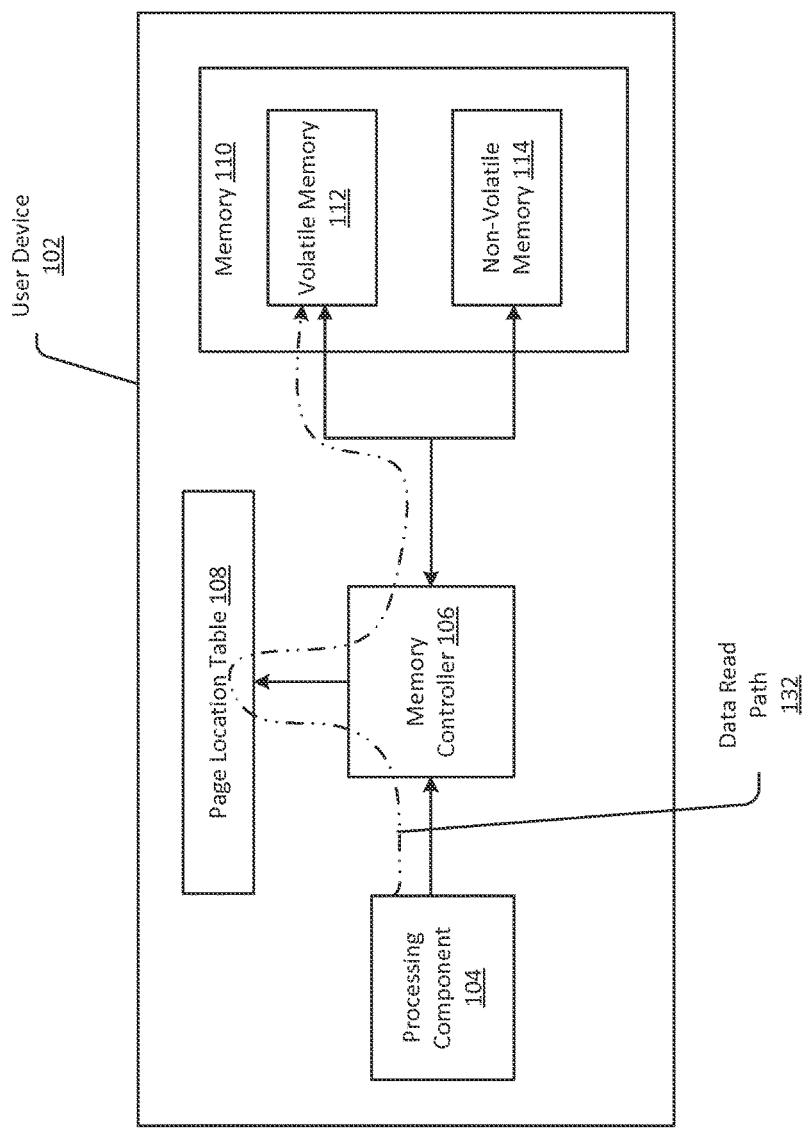
FIG. 1C illustrates a schematic diagram of another example data read path in accordance with one or more embodiments of the disclosure.

FIG. 1C illustrates a block diagram depicting another example data read path for reading a memory location according to one or more example embodiments. For example, the memory controller 106 may receive an indication (e.g., from the processing component 104) to read data from a memory location corresponding to page location identifier 120B. In response, and following the data read path 132, the memory controller 106 may read the page status indicator 118B from table entry 116B. As shown in FIG. 1A, the page status indicator 118B may indicate a dirty memory page. In certain embodiments, the dirty memory page may indicate that the newest version and/or copy of data that has been written to a memory location corresponding to page location identifier 120B is stored in the volatile memory 112. As a result, the memory controller 106 may read data stored in the memory location of the volatile memory 112 corresponding to page location identifier 120B.

Figure 1D:
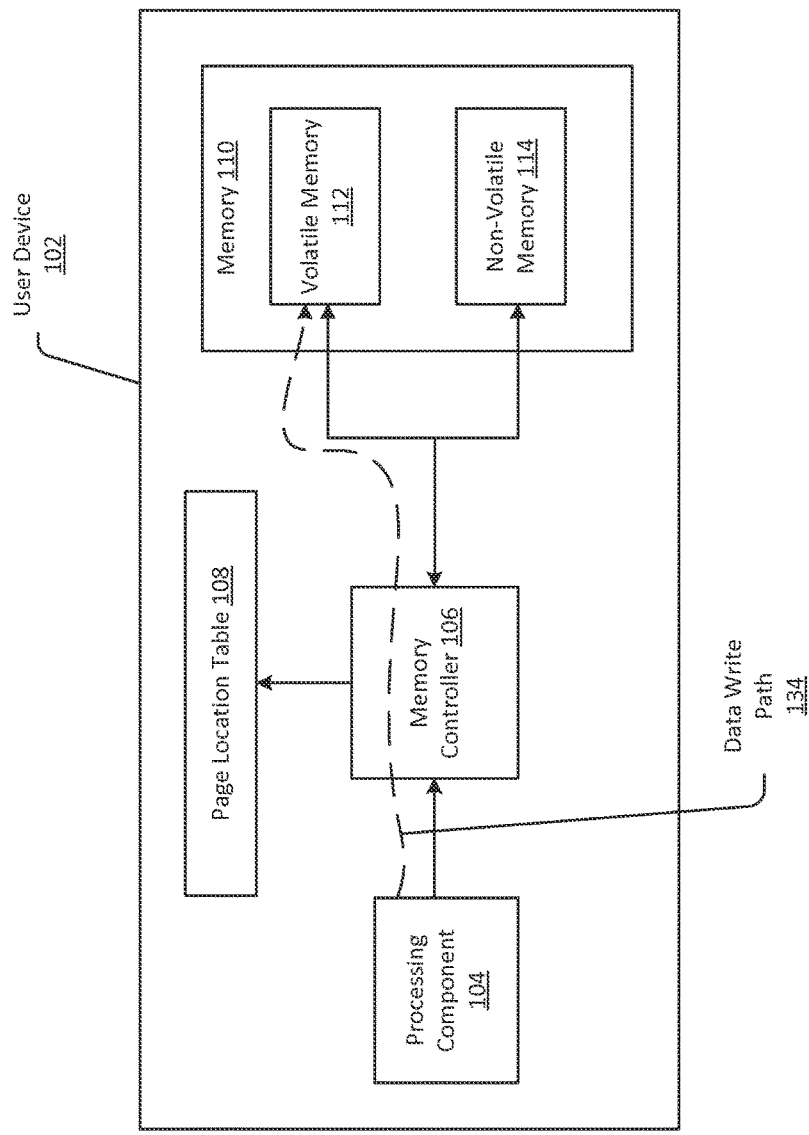
FIG. 1D illustrates a schematic diagram of an example data write path in accordance with one or more embodiments of the disclosure.

FIG. 1D illustrates a block diagram depicting an example data write path 134 for writing to a memory location according to one or more example embodiments. For example, the memory controller 106 may receive an indication (e.g., from the processing component 104) to write data to a memory location corresponding to page location identifier 120C. In response, the memory controller 106 may write the data to a memory location in the volatile memory 112 corresponding to the page location identifier 120C. Furthermore, the memory controller 106 may read the page status indicator 118C from table entry 116C. As shown in FIG. 1B, the page status indicator 118C may indicate a clean memory page. As a result, the memory controller 106 may overwrite and/or otherwise change the page status indicator 118C in table entry 116C to reflect a dirty memory page.

As a result of example embodiments described herein, different types of data may be stored with respect to the volatile memory 112 and the non-volatile memory 114. For example all data, including static data, may typically be stored in volatile memory 112 so as to support relatively fast wake-up times (e.g., transition times) for the user device 102 from a low power state. However, certain non-volatile memory 114 may also support relatively fast wake-up times, such as PCM, RRAM, and/or the like. Therefore, according to certain embodiments, operating systems, applications, code, and/or other types of static data that experience relatively low to zero amounts of write operations may be stored in the non-volatile memory 114. Dynamic data, including video data, audio data, other media data, game data, and/or other types of data that experience a relatively frequent amount of write operations may be stored in the volatile memory 112.

Figure 2:
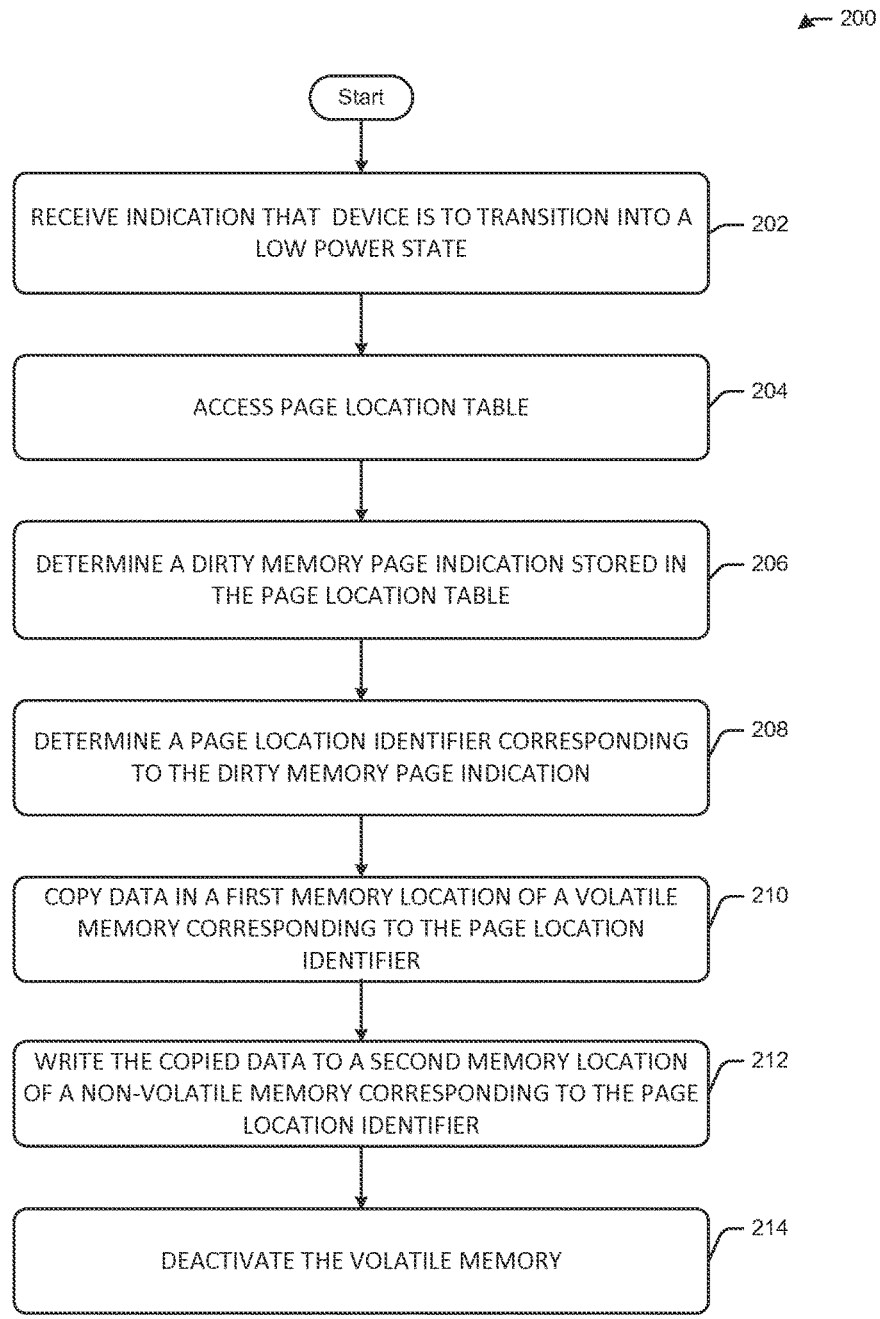
FIG. 2 illustrates a flow diagram for reducing power consumption in an example memory architecture in a device in accordance with one or more embodiments of the disclosure.

Referring now to FIG. 2, a flow diagram of an example method 200 for reducing power consumption in a memory architecture is illustrated according to one or more example embodiments. The method 200 may begin in block 202 where a memory controller (e.g., memory controller 106) may receive an indication that a device (e.g., user device 102) is to transition into a low power state. In block 204, the memory controller 106 may access a page location table (e.g., page location table 108).

In block 206, the memory controller 106 may determine a dirty memory page indication stored in the page location table 108. For example, a page status indicator (e.g., page status indicator 118B) stored in the page location table 108 may indicate the dirty memory page indication. In block 208, the memory controller 106 may determine a page location identifier corresponding to the dirty memory page indication. In block 210, the memory controller 106 may copy data in a first memory location of a volatile memory (e.g., volatile memory 112) corresponding to the page location identifier. In block 212, the memory controller 106 may write the copied data to a second memory location of a non-volatile memory (e.g., non-volatile memory 114) corresponding to the page location identifier. In block 214, the memory controller 106 may deactivate the volatile memory. As mentioned, according to one or more embodiments, deactivating the volatile memory (e.g., volatile memory 112) may include deactivating a memory refresh operation and/or capability of the volatile memory. For instance, the memory refresh operation of the volatile memory may cause the charges of one or more capacitors in the volatile memory to be restored. However, the memory refresh operation may be associated with additional power consumption by the volatile memory. Thus, deactivating the memory refresh operation and/or capability of the volatile memory may reduce power consumption of a user device (e.g., user device 102). In other implementations, however, the deactivating the volatile memory may include reducing the power supplied to the volatile memory and/or switching the volatile memory to an off state.

Figure 3:
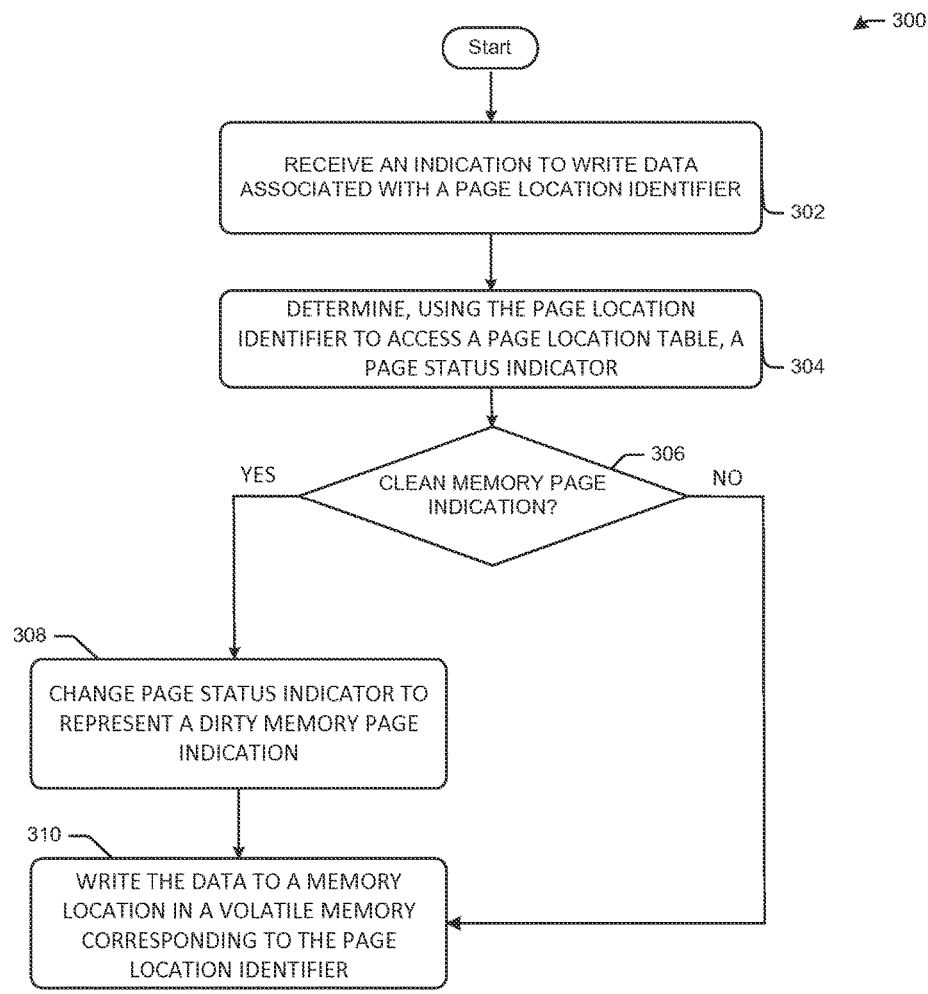
FIG. 3 illustrates another flow diagram for an example process for writing data in in accordance with one or more embodiments of the disclosure.

Referring now to FIG. 3, a flow diagram of an example method 300 for writing data is illustrated according to one or more example embodiments. The method 300 may begin in block 302 where a memory controller (e.g., memory controller 106) may receive an indication to write data associated with a page location identifier. In block 304, the memory controller 106 may determine, using the page location identifier to access a page location table, a page status indicator.

In decision block 306, the memory controller 106 may determine whether the page status indicator represents a clean memory page indication. If the memory controller 106 determines that the page status indicator does not represent a clean memory page indication (e.g., representing instead a dirty memory page indication), the method 300 may proceed directly to block 310. If the memory controller 106 determines that the page status indicator does represent a clean memory page indication, the method 300 may proceed to block 308. In block 308, the memory controller 106 may change the page status indicator to represent a dirty memory page indication, such as by overwriting the page status indicator. In block 310, the memory controller 106 may write the data to a memory location in a volatile memory (e.g., volatile memory 112) corresponding to the page location identifier.

Figure 4:
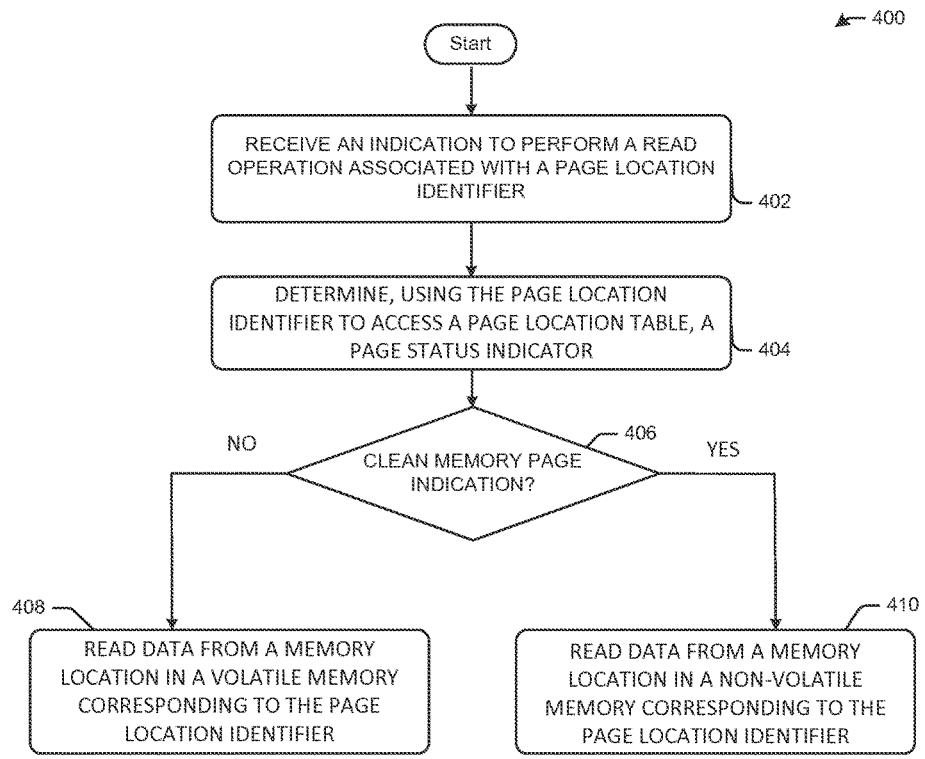
FIG. 4 illustrates another flow diagram for an example process for reading data in accordance with one or more embodiments of the disclosure.

Referring now to FIG. 4, a flow diagram of an example method 400 for reading data is illustrated according to one or more example embodiments. The method 400 may begin in block 402 where a memory controller (e.g., memory controller 106) may receive an indication to read data associated with a page location identifier. In block 404, the memory controller 106 may determine, using the page location identifier to access a page location table, a page status indicator.

In decision block 406, the memory controller 106 may determine whether the page status indicator represents a clean memory page indication. If the memory controller 106 determines that the page status indicator does not represent a clean memory page indication (e.g., representing instead a dirty memory page indication), the method 400 may proceed to block 408. In block 408, the memory controller 106 may read data from a memory location in a volatile memory (e.g., volatile memory 112) corresponding to the page status identifier. If the memory controller 106 determines that the page status indicator does represent a clean memory page indication, the method 400 may proceed to block 410. In block 410, the memory controller 106 may read data from a memory location in a non-volatile memory (e.g., non-volatile memory 114) corresponding to the page status identifier.

Figure 5:
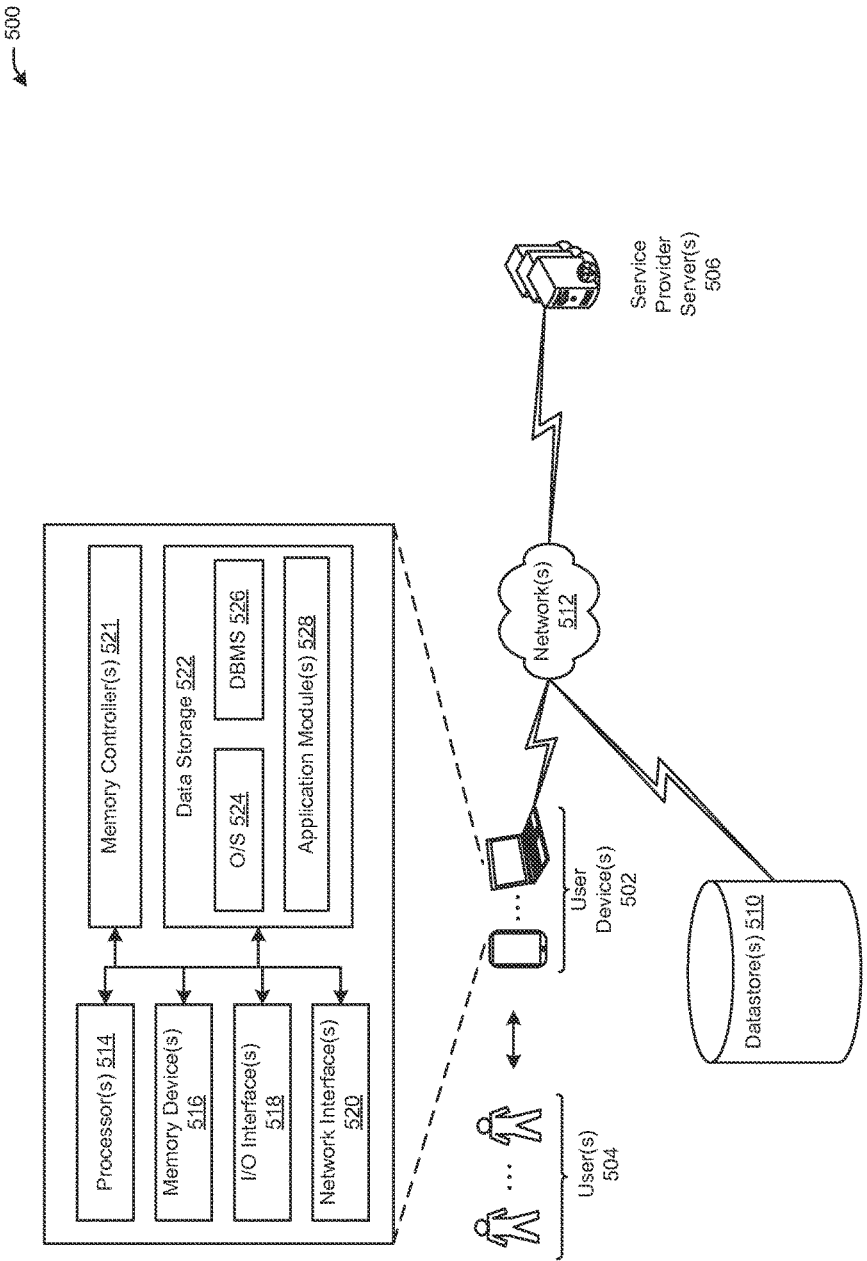
FIG. 5 illustrates a more detailed schematic block diagram of an example system architecture in accordance with one or more example embodiments of the disclosure.

FIG. 5 is a more detailed schematic block diagram of an illustrative system architecture 500 in accordance with one or more example embodiments of the disclosure. In certain example embodiments, certain components of the architecture 500 may represent a particular implementation or configuration of corresponding components in architecture 100 of FIG. 1A. For example, the user device 502 may represent a particular implementation or configuration of the user device 102 in FIG. 1A in accordance with one or more example embodiments of the disclosure. It should be appreciated that FIG. 5 depicts merely example architectural and device configurations and that numerous modifications, variations, or the like are within the scope of this disclosure. Although certain elements in the following description may be described in the singular for purposes of clarity, it will be appreciated that such descriptions also apply to elements in the plural.

In an illustrative configuration, the user device 502 may include one or more processors (processor(s)) 514, one or more memory devices 516 (generically referred to herein as memory 516), one or more input/output ("I/O") interface(s) 518, one or more network interface(s) 520, one or memory controller(s) 521, and data storage 522. The user device 502 may also be in communication with one or more service provider servers 506 (hereinafter referred to in the singular).

Referring back to the user device 502, the memory 516 may include volatile memory (memory that maintains its state when supplied with power) such as random access memory (RAM) and/or non-volatile memory (memory that maintains its state even when not supplied with power) such as read-only memory (ROM), flash memory, phase-change memory (PCM), resistive random access memory (RRAM), and so forth. In various implementations, the memory 516 may include multiple different types of memory, such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 516 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The memory controller 521 may include a microprocessor, ASIC, and/or any other component capable of performing write and read functions with respect to the memory 516. In certain embodiments, the memory controller 521 may correspond to the memory controller 106 in FIG. 1A. As such, the memory controller 521 may perform similar operations as the memory controller 106 with respect to the memory 516.

The data storage 522 may include removable storage and/or non-removable storage including, but not limited to, magnetic storage, optical disk storage, and/or tape storage. The data storage 522 may provide non-volatile storage of computer-executable instructions and other data. The data storage 522 may include storage that is internal and/or external to the user device 502. The memory 516 and the data storage 522, removable and/or non-removable, are examples of computer-readable storage media (CRSM) as that term is used herein. Furthermore, while the memory 516 and the data storage 522 are illustrated as separate components, it will be appreciated that in certain embodiments, one or more portions of the memory 516 and one or more portions of the data storage 522 may overlap. For instance, the data storage 522 may include the non-volatile memory described above with respect to the memory 516.

The data storage 522 may store computer-executable instructions that are loadable into the memory 516 and executable by the processor(s) 514 to cause various operations to be performed. The data storage 522 may additionally store data that may be copied to memory 516 for use by the processor(s) 514 during the execution of the computer-executable instructions. Moreover, output data generated as a result of execution of the computer-executable instructions by the processor(s) 514 may be stored initially in memory 516, and may ultimately be copied to data storage 522 for non-volatile storage.

More specifically, the data storage 522 may store one or more operating systems (O/S) 524; one or more database management systems (DBMS) 526; and one or more program modules, applications, or the like such as, for example, one or more application modules 528. The application module(s) 528 may include computer-executable instructions that, responsive to execution by one or more of the processor(s) 514, may cause operations to be performed for the execution of various applications. Various types of applications are contemplated including, but not limited to, reading applications, social media applications, game applications, media applications, financial applications, messaging applications, email applications, web-browsing applications, and/or the like.

Referring now to other illustrative components of the user device 502, the O/S 524 may be loaded into the memory 516 and may provide an interface between other application software executing on the user device 502 and hardware resources of the user device 502. More specifically, the O/S 524 may include a set of computer-executable instructions for managing hardware resources of the user device 502 and for providing common services to other application programs (e.g., managing memory allocation among various application programs). The O/S 524 may include any operating system now known or which may be developed in the future including, but not limited to, any server operating system, any mainframe operating system, or any other proprietary or non-proprietary operating system.

The DBMS 526 may be loaded into the memory 516 and may support functionality for accessing, retrieving, storing, and/or manipulating data stored in one or more of the datastores 510, data stored in the memory 516, and/or data stored in the data storage 522. The DBMS 526 may use any of a variety of database models (e.g., relational model, object model, etc.) and may support any of a variety of query languages.

The processor(s) 514 may be configured to access the memory 516 and execute computer-executable instructions stored therein. For example, the processor(s) 514 may be configured to execute computer-executable instructions of the various program modules of the user device 502 to cause or facilitate various operations to be performed in accordance with one or more embodiments of the disclosure. The processor(s) 514 may include any suitable processing unit capable of accepting data as input, processing the input data in accordance with stored computer-executable instructions, and generating output data. The processor(s) 514 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 514 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 514 may be capable of supporting any of a variety of instruction sets.

The user device 502 may further include one or more input/output (I/O) interfaces 518 that may facilitate the receipt of input information by the user device 502 from one or more I/O devices as well as the output of information from the user device 502 to the one or more I/O devices. The I/O devices may include, for example, one or more user interface devices that facilitate interaction between a user and the user device 502 including, but not limited to, a display, a keypad, a pointing device, a control panel, a touch screen display, a remote control device, a microphone, a speaker, a gesture detection or receiving device, and so forth. The I/O devices may further include, for example, any number of peripheral devices such as data storage devices, printing devices, and so forth.

The user device 502 may be configured to communicate with any of a variety of other systems, platforms, networks, devices, and so forth (e.g., a service provider server 506, etc.) via one or more of the network(s) 512. The user device 502 may include one or more network interfaces 520 that may facilitate communication between the user device 502 and any of the systems, networks, platforms, devices, or components of the system architecture 500.

Although not explicitly depicted or described, it should be appreciated that a service provider server 506 may include similar hardware, software, or firmware components and/or additional or alternate hardware, software, or firmware components as those described through reference to the user device 502.

It should be appreciated that the program modules, applications, computer-executable instructions, code, or the like depicted in FIG. 5 as being stored in the data storage 522 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the user device 502, the service provider server 506, and/or hosted on other computing device(s) accessible via one or more of the network(s) 512 may be provided to support functionality provided by the program modules, applications, or computer-executable code depicted in FIG. 5 and/or additional or alternate functionality. Further, functionality may be modularized differently such that processing described as being supported collectively by the collection of program modules depicted in FIG. 5 may be performed by a fewer or greater number of modules, or functionality described as being supported by any particular module may be supported, at least in part, by another module. In addition, program modules that support the functionality described herein may form part of one or more applications executable across any number of systems or devices of the system architecture 500 in accordance with any suitable computing model such as, for example, a client-server model, a peer-to-peer model, and so forth. In addition, any of the functionality described as being supported by any of the program modules depicted in FIG. 5 may be implemented, at least partially, in hardware and/or firmware across any number of devices.

It should further be appreciated that the user device 502, the service provider server 506, or any other illustrative component of the system architecture 500 may include alternate and/or additional hardware, software, or firmware components beyond those described or depicted without departing from the scope of the disclosure. More particularly, it should be appreciated that software, firmware, or hardware components depicted as forming part of any entity included in the architecture 500 are merely illustrative and that some components may not be present or additional components may be provided in various embodiments. While various illustrative program modules have been depicted as software modules stored in data storage, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

One or more operations of the method 200, the method 300, or the method 400 may have been described above as being performed by a memory controller (e.g., memory controller 106 or memory controller 521). It should be appreciated, however, that any of the operations of method 200, the method 300, or the method 400 may be performed by another device or component of the system architecture 500 or a device or component of another implementation of the architecture 100. In addition, it should be appreciated that processing performed in response to execution of computer-executable instructions provided as part of an application, program module, or the like may be interchangeably described herein as being performed by the application or the program module itself, by a device on which the application, program module, or the like is executing, or by a system that includes such a device. While the operations of the method 200, the method 300, or the method 400 may have been described in the context of the illustrative system architecture 100 or system architecture 500, it should be appreciated such methods may be implemented in connection with numerous other architectural and device level configurations.

In addition, the operations described and depicted in the illustrative methods of FIGS. 2, 3, and 4 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 2, 3, and 4 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program modules, applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

The invention claimed is:

1. A device, comprising:
   at least one processor;
   a dynamic random access memory (DRAM);
   a non-volatile memory; and
   a memory controller to receive computer-executable instructions from the at least one processor, wherein the computer-executable instructions cause the memory controller to:
   receive a first indication of a transition of the device into a sleep state;
   access a page location table stored in the DRAM, the page location table comprising a first table entry and a second table entry of a group of table entries, a first clean page status indicator, a first dirty page status indicator, a first page address identifier, and a second page address identifier, wherein the second page address identifier directly corresponds to a first memory address location in the DRAM and a second memory address location in the non-volatile memory, and wherein respective positions of the first memory address location and the second memory address location are the same;

read the first clean page status indicator from the first table entry, wherein the first table entry is indexed by the first page address identifier, and wherein the first clean page status indicator indicates that a first most recently written memory page, corresponding to the first page address identifier, is stored in the non-volatile memory;

read a first dirty page status indicator from a second table entry of the group of table entries, wherein the second table entry is indexed by the second page address identifier, wherein the first dirty page status indicator indicates that a second most recently written memory page, corresponding to the second page address identifier, is stored in the DRAM, wherein the first dirty page status indicator further indicates that first data stored in the first memory address location in the DRAM corresponding to the second page address identifier is new relative to second data stored in the second memory address location in the non-volatile memory corresponding to the second page address identifier;

copy, based at least in part on the second page address identifier, first data from the first memory address location in the DRAM to the second memory address location in the non-volatile memory; and reduce a power supplied to the DRAM to a finite power level to deactivate a memory refresh operation of the DRAM, wherein the memory refresh operation causes a charge of a capacitor included in the DRAM to be restored.

2. The device of claim 1, wherein the computer-executable instructions further cause the memory controller to:

receive a second indication to perform a read operation corresponding to a third page address identifier;

read a second clean page status indicator from a third table entry of the group of table entries, wherein the third table entry is indexed by the third page address identifier, and wherein the second clean page status indicator indicates that a third most recently written memory page, corresponding to the third page address identifier, is stored in the non-volatile memory; and read third data from a third memory address location in the non-volatile memory, the third memory address location corresponding to the third page address identifier.

3. The device of claim 1, wherein the computer-executable instructions further cause the memory controller to:

receive a second indication to perform a read operation corresponding to a third page address identifier;

read a second dirty page status indicator from a third table entry of the group of table entries, wherein the third table entry is indexed by the third page address identifier, and wherein the second dirty page status indicator indicates that a third most recently written memory page, corresponding to the third page address identifier, is stored in the DRAM; and read third data from a third memory address location in the DRAM, the third memory address location corresponding to the third page address identifier.

4. The device of claim 1, wherein the computer-executable instructions further cause the memory controller to:

receive a second indication to perform a write operation to a third memory address location corresponding to a third page address identifier;

write third data to the third memory address location in the DRAM;

identify, using the third page address identifier, a third table entry from the group of table entries; and store a second dirty page status indicator in the third table entry.

5. A method, comprising:

receiving, by a memory controller of a device, an indication that the device is to transition from a first power state to a second power state;

accessing, by the memory controller, a page location table stored in a volatile memory of the device, the page location table comprising a first table entry, a dirty page status indicator, and a first page location identifier, wherein the first page location identifier directly corresponds to a first memory location in the volatile memory and a second memory location in a non-volatile memory of the device, wherein the dirty page status indicator is indicative of a most recently written memory page stored in the volatile memory, and wherein respective positions of the first memory location and the second memory location are the same;

determining, by the memory controller using the first page location identifier, that the dirty page status indicator indicates that first data stored in the first memory location in the volatile memory is new relative to second data stored in the second memory location in the non-volatile memory of the device;

copying, by the memory controller, based at least in part on the first page location identifier, the first data stored in the first memory location in the volatile memory to the second memory location in the non-volatile memory of the device; and reducing a power supplied to the volatile memory to a finite power level to deactivate a memory refresh operation associated with the volatile memory.

6. The method of claim 5, the first power state associated with a first amount of power consumed by the device, the second power state associated with a second amount of power consumed by the device, wherein the second amount of power is less than the first amount of power.

7. The method of claim 5, further comprising:

writing over each of one or more dirty page status indicators stored in the page location table with a respective clean memory page indication.

8. The method of claim 5, further comprising:

determining, by the memory controller, using a second page location identifier, a first clean memory page indication stored in the page location table, wherein the first clean memory page indication indicates that a most recently stored data associated with the second page location identifier is stored in the non-volatile memory.

9. The method of claim 5, further comprising:

receiving, by the memory controller, an indication to perform a read operation using a second page location identifier;

reading, by the memory controller using the second page location identifier, a first clean memory page indication from the page location table; and reading third data from a third memory location in the non-volatile memory, the third memory location corresponding to the second page location identifier.

10. The method of claim 5, further comprising:
receiving, by the memory controller, an indication to perform a read operation using a second page location identifier;
reading, by the memory controller using the second page location identifier, a second dirty memory page indication from the page location table; and
reading third data from a third memory location in the volatile memory, the third memory location corresponding to the second page location identifier.

11. The method of claim 5, further comprising:
receiving, by the memory controller, an indication to write third data; and
writing, by the memory controller, the third data to a third memory location in the volatile memory using a second page location identifier, the third memory location corresponding to the second page location identifier.

12. The method of claim 11, further comprising:
storing a second dirty memory page indication in an entry of the page location table, wherein the entry is indexed by the second page location identifier.

13. A device, comprising:
at least one processor;
a volatile memory;
a non-volatile memory; and
a memory controller to receive computer-executable instructions from the at least one processor, wherein the computer-executable instructions cause the memory controller to:
receiving an indication that the device is to transition from a first power state to a second power state;
access a page location table stored in the volatile memory, the page location table comprising a first table entry, a dirty page status indicator, and a first page location identifier, wherein the first page location identifier directly corresponds to a first memory location in the volatile memory and a second memory location in the non-volatile memory, wherein the dirty page status indicator is indicative of a most recently written memory page stored in the volatile memory, and wherein respective positions of the first memory location and the second memory location are the same;
determine, using the first page location identifier, that the dirty page status indicator indicates first data stored in the first memory location in the volatile memory is new relative to second data stored in the second memory location in the non-volatile memory;
copy, based at least in part on the first page location identifier, the first data stored in the first memory location in the volatile memory to the second memory location in the non-volatile memory; and
reduce a power supplied to the volatile memory to a finite power level to deactivate a memory refresh operation associated with the volatile memory.

14. The device of claim 13,
the first power state associated with a first amount of power consumed by the device,
the second power state associated with a second amount of power consumed by the device,
wherein the second amount of power is less than the first amount of power.

15. The device of claim 13, wherein the computer-executable instructions further cause the memory controller to:
determine, using a second page location identifier, a first clean memory page indication stored in the page location table, wherein:
the first clean memory page indication indicates that a most recently stored data associated with the second page location identifier is stored in the non-volatile memory.

16. The device of claim 13, wherein the computer-executable instructions further cause the memory controller to:
receive an indication to perform a read operation using a second page location identifier;
read, using the second page location identifier, a first clean memory page indication from the page location table; and
read third data from a third memory location in the non-volatile memory, the third memory location corresponding to the second page location identifier.

17. The device of claim 13, wherein the computer-executable instructions further cause the memory controller to:
receive an indication to perform a read operation using a second page location identifier;
read, using the second page location identifier, a second dirty memory page indication from the page location table; and
read third data from a third memory location in the volatile memory, the third memory location corresponding to the second page location identifier.

18. The device of claim 13, wherein the computer-executable instructions further cause the memory controller to:
receive an indication to write third data using a second page location identifier; and
write the third data to a third memory location in the volatile memory, the third memory location corresponding to the second page location identifier.

* * * * *